United States Patent
Illegems

(10) Patent No.: US 8,633,736 B2
(45) Date of Patent: Jan. 21, 2014

(54) DRIVER WITH ACCURATELY CONTROLLED SLEW RATE AND LIMITED CURRENT

(75) Inventor: Paul F. Illegems, Tucson, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 681 days.

(21) Appl. No.: 12/789,005

(22) Filed: May 27, 2010

(65) Prior Publication Data

US 2011/0291707 A1    Dec. 1, 2011

(51) Int. Cl.
*H03K 3/00* (2006.01)

(52) U.S. Cl.
USPC ........................................................ 327/108

(58) Field of Classification Search
USPC ......... 327/108–112, 179, 423–427, 374–376, 327/530, 170, 389, 391; 326/21–27, 82–85, 326/87–89; 323/282; 365/230.06
See application file for complete search history.

(56) References Cited

U.S. PATENT DOCUMENTS

| | | | |
|---|---|---|---|
| 4,791,326 A | 12/1988 | Vajdic et al. | |
| 5,225,720 A | 7/1993 | Kondoh et al. | |
| 7,521,986 B2 * | 4/2009 | Mitsuda | 327/530 |
| 2002/0005743 A1 | 1/2002 | Tanaka | |
| 2003/0025541 A1 | 2/2003 | Humphrey et al. | |
| 2004/0135528 A1 * | 7/2004 | Yasohara et al. | 318/254 |
| 2009/0066415 A1 * | 3/2009 | Kim | 330/253 |
| 2009/0102443 A1 * | 4/2009 | Smith | 323/282 |

OTHER PUBLICATIONS

Invitation to Pay Additional Fees in International Application No. PCT/US2011/035474 dated Jan. 20, 2012, 6 pages.

* cited by examiner

*Primary Examiner* — Lincoln Donovan
*Assistant Examiner* — Sibin Chen
(74) *Attorney, Agent, or Firm* — King & Spalding L.L.P.

(57) ABSTRACT

A driver circuit, that provides slew rate control of its output voltage, including a current generator, an output transistor, and optionally, a capacitor. The current generator has an input port, an output port and reference port. The output port couples to the gate of the output transistor. The capacitor couples between the gate and drain of the output transistor. The current generator controls a current $I_S$ flowing through the output port based on an input voltage at the input port. The current generator limits the absolute value of the current $I_S$ to be less than or equal to a maximum determined by a reference current Iref provided at the reference port. Modifications may be made to the driver circuit to limit the output current (e.g., as a function of the output voltage) and to make the slew rate limit independent of the gate-drain capacitance of the output transistor.

19 Claims, 14 Drawing Sheets

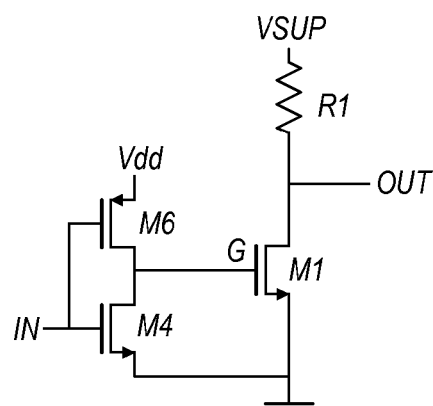 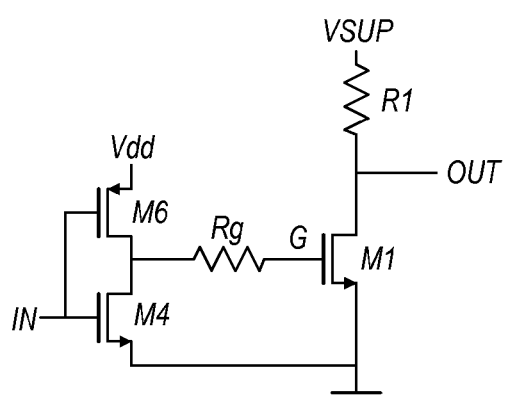
FIG. 1A  FIG. 1B
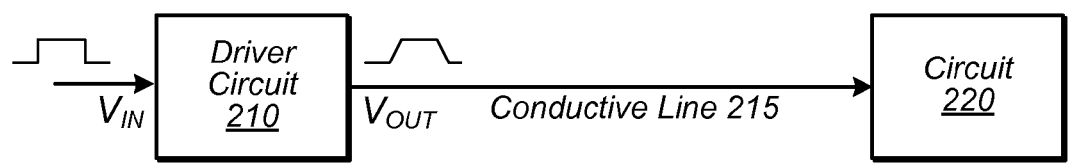
FIG. 2

DRIVER WITH ACCURATELY CONTROLLED SLEW RATE AND LIMITED CURRENT

FIELD OF THE INVENTION

The present invention relates to the field of circuit design, and, more particularly, to a system and method for controlling the slew rate and current at the output of a driver circuit.

DESCRIPTION OF THE RELATED ART

There are two fundamental issues in the design of driver circuits. First, when driving a signal bus in a system environment, it is important to control the slope dV/dt of the output voltage V(t) generated by the driver circuit. The bandwidth of the output voltage V(t) depends in significant measure on the maximum of |dV/dt|. Thus, when |dV/dt| is larger than necessary, the output signal V(t) will have unwanted high frequencies that may cause EMI or other problems in the system. The maximum of |dV/dt| is common referred to as the "slew rate". Second, when the output of a driver circuit is shorted to ground or a supply rail, very high current may flow. If the short-circuit current is not limited it may destroy the driver circuit due to high power dissipation.

FIG. 1A shows a basic driver circuit that has no slew rate control and does not limit the current through the output device M1, which may be a large device, capable of high current. In FIG. 1B, the slew rate at the output is reduced by inserting a resistor $R_g$ at the gate of the output device. The resulting slew rate and propagation delay will vary considerably across all the variations of process, supply voltage VSUP and temperature (which variations are commonly referred to as "PVT variations").

Another simple way to reduce the slew rate and to limit the output current is to insert a series resistance into the driver output or in the drain of M1. Unfortunately, the output current is limited at the cost of decreased output amplitude and the slew rate may become dependent on the load at the output.

Many of the other existing solutions are complicated and require many extra components.

SUMMARY

In one set of embodiments, a driver circuit having a limited slew rate may include a current generator, an output transistor, and optionally, a capacitor. The current generator has an input port, an output port and reference port. The gate of the output transistor may be coupled to the output port of the current generator. The capacitor, if present, may be coupled between the gate and the drain of the output transistor. The current generator may be configured to control a current $I_S$ flowing through the output port based on an input voltage appearing at the input port. The current generator may be configured to limit the absolute value of the current $I_S$ to be less than or equal to a maximum that is determined by a reference current provided at the reference port.

In some embodiments, the current generator includes: a transistor A; a first chain of transistors; and a second chain of transistors. The first chain and the second chain may be coupled in parallel between a drive voltage and ground. A first transistor of the first chain may be coupled to form a current mirror with a first transistor of the second chain. The transistor A may be configured to form a current mirror with a last transistor of the first chain. The transistor A may also be configured to form a current mirror with a last transistor of the second chain. The reference current may be provided to the drain of the transistor A. The input port may be coupled to the gates of second and third transistors in the second chain. The second and third transistors of the second chain may be coupled together in drain-to-drain fashion. The node where to the two drains meet may be coupled to the output port of the current generator.

In some embodiments, the driver circuit may also include a transistor B whose drain is coupled to a drive voltage node of the current generator. The gate and drain of the transistor B may be shorted together (i.e., connected together). The drive voltage node may be driven (supplied) with a known current Idrive.

In some embodiments, the driver circuit may also include a transistor C whose gate is coupled to the drain of the output transistor, where the drain of the transistor C is coupled to the drive voltage node of the current generator, where the source of the transistor C is coupled to ground through a resistor.

In some embodiments, the transistor B is coupled to the drive voltage node through a resistor.

In some embodiments, the output port of the current generator is coupled to the gate of the output transistor through an amplifier (e.g., an amplifier including a diamond follower circuit). The amplifier may include an input stage and an output stage that are coupled together. The input stage may be coupled between a voltage node Vdd and ground. A supply voltage node of the current generator may be coupled to the voltage node Vdd. The output stage of the amplifier may be coupled between a voltage node Vdrive and ground. Thus, the input and output stages may be driven by different supply voltages.

In one set of embodiments, a bridge driver device may include four driver circuits coupled in an H-bridge topology. Each of the four driver circuits may include: a current generator and an output transistor, where the current generator has an input port, an output port and reference port, where the output port of the current generator is coupled to the gate of the output transistor, where the current generator is configured to control a first current flowing through the output port based on an input voltage appearing at the input port, where the current generator is configured to limit the absolute value of the first current to be less than or equal to a maximum that is determined by a reference current provided at the reference port.

In some embodiments, each of the four driver circuits also includes a capacitor that couples between the gate of the corresponding output transistor and the drain of the corresponding output transistor.

In some embodiments, the bridge driver device is used to drive a fan (or some other electrical device).

In one set of embodiments, the current generator circuit may include: a first transistor, a second transistor, a third transistor, a first pair of switches and a second pair of switches. A drain of the second transistor and a drain of the third transistor may be connected to each other and to an output port of the current generator. A source of the second transistor may be coupled to a drive voltage node. A source of the third transistor may be coupled to ground.

The first pair of switches may be configured to turn off the third transistor and to enable a first connection when the input voltage is low. When the first connection is enabled, the second transistor may be controlled by a fourth transistor in a first current mirror relationship. The second pair of switches may be configured to turn off the second transistor and to enable a second connection when the input voltage is high. When the second connection is enabled, the third transistor may be controlled by the first transistor in a second current mirror relationship. The fourth transistor may couple in series with a fifth transistor between the drive voltage node and ground. The fifth transistor may be controlled by the first transistor in a third current mirror relationship.

BRIEF DESCRIPTION OF THE DRAWINGS

FIG. 1A shows a basic driver circuit that has no slew rate control and does not limit the current through the output device M1.

FIG. 1B shows a driver circuit where the slew rate at the output is reduced by inserting a resistor $R_g$ at the gate of the output device.

FIG. 2 shows a system including a driver circuit 210, according to one embodiment.

Figure 3:
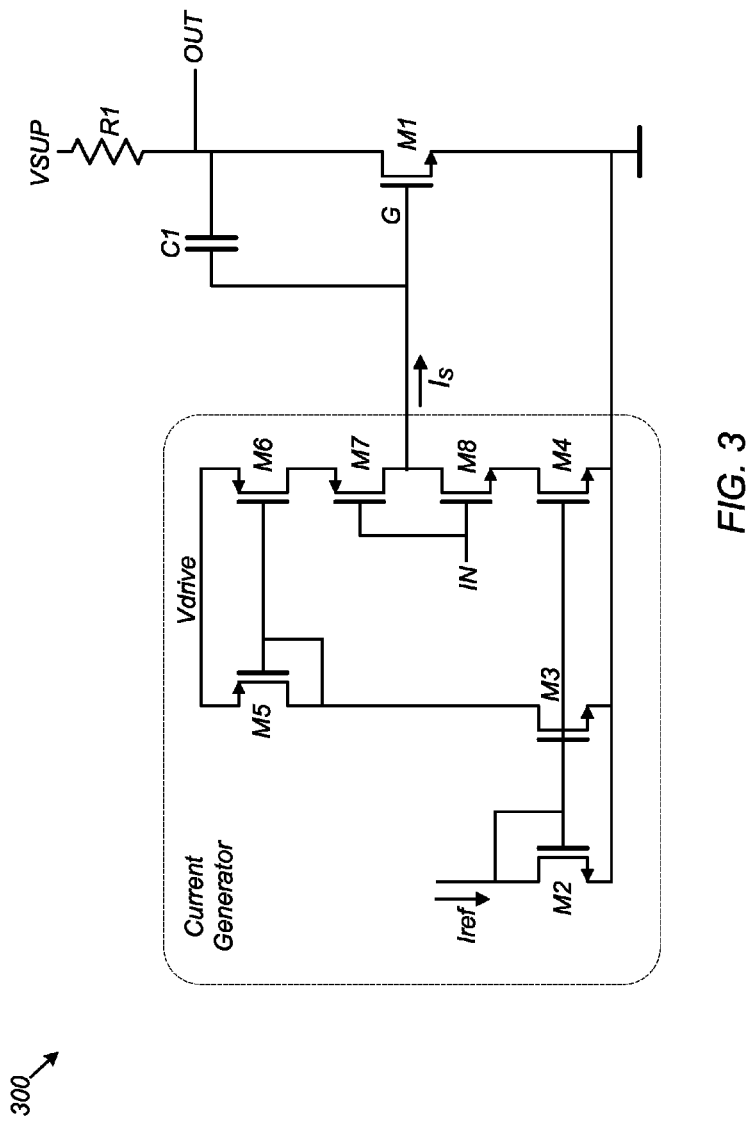
FIG. 3 shows one embodiment of a driver circuit with accurate slew rate control.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

FIG. 2 illustrates a system including a driver circuit 210, according to one embodiment. As shown, the driver circuit 210 receives an input voltage $V_{IN}$ at its input port, and generates an output voltage $V_{OUT}$ at its output port. The output port is coupled to a circuit 220 through a conductive line 215. The driver circuit may be configured so that the output voltage $V_{OUT}$ generally follows (or, is responsive to) the input voltage $V_{IN}$. Furthermore, the driver circuit may be configured so that the output voltage $V_{OUT}$ has a limited slew rate. In other words, the output voltage is controlled so that the absolute value of its slope is less than or equal to a maximum value.

In some embodiments, the conductive line may be a conductive trace within an integrated circuit. In other embodiments, the conductive line may be a connection between two chips in a larger system. In some embodiments, the conductive line may be part of a multi-line data bus. In some embodiments, the conductive line may be connection between two computers in a network. In some embodiments, the conductive line may be part of a telephone line.

The circuit 220 may be digital circuit, an analog circuit, or a mixed analog-and-digital circuit. In some embodiments, the circuit 220 may be a motor or a fan.

In one set of embodiments, a driver circuit may employ a capacitor C1, a current generator and a gain stage to charge and discharge the gate of an output transistor. The slew rate of the output voltage from the output transistor may be accurately controlled by setting the amount of current Iref supplied to the current generator. Furthermore, the output current of the driver circuit may be limited independent of the slew rate limit. In some embodiments, the driver circuit is configured so that the slew rate limit depends only on the current Iref and the capacitance C1. Furthermore, in some embodiments, the driver circuit is configured so that the slew rate limit is independent of the following: (a) the type of output transistor (NMOS or PMOS); (b) the size of the output transistor; (c) the limit imposed on the output current; (d) the load at the output of the driver circuit; and (e) the supply voltage.

FIG. 3 shows a driver circuit 300 with an output transistor M1 and a pullup resistor R1. A wide variety of other configurations are possible. For example, in one alternative embodiment, resistor R1 may be replaced with a PMOS driver.

When the input (IN) is at ground, i.e., $V_{IN}=0$, transistor M8 will be off and transistor M7 will be on. In a steady state, the voltage at the gate G of transistor M1 is then equal to Vdrive; transistor M1 is on; the output (OUT) is low; and current $I_S=0$.

When the voltage $V_{IN}$ at the input changes from low to high, transistor M7 will turn off, transistor M8 will turn on, and current $I_S$ will flow from the gate of M1 through M8 and M4 to ground (GND). Current $I_S$ is proportional to the current Iref because it will be dictated by the current mirror M2/M4. (Current mirror M2/M4 is the current mirror configured from transistors M2 and M4 as shown in FIG. 3, i.e., configured so that the gates of M2 and M4 are coupled together, and so that the gate and drain of M2 are coupled together.) Current $I_S$ charges the capacitor C1 as well as the gate-drain capacitance of M1 until $V_G=0$ volts. (The voltage across C1 will increase.) The output transitions from low to high.

When the input changes from high to low, transistor M8 will turn off, transistor M7 will turn on, and transistor M6 will charge the capacitance at node G until $V_G$=Vdrive. Again, the current $I_S$ will be proportional to Iref, due to the current mirrors M2/M3 and M5/M6. The output will transition from high to low.

In the region where the output changes from low to high and vice-versa, M1 has a gain $A_{M1}$ given by the expression:

$$A_{M1}=dV_{OUT}/dV_G,$$

where $V_G$ is the voltage at the gate of M1, and $V_{OUT}$ is the output voltage.

Due to the Miller effect, the total capacitance $C_G$ seen at the gate of M1 is much larger than C1. The total capacitance may be approximated by the following expression:

$$C_G = (A_{M1}+1)(C1+C_{gd,M1})+C_{gs,M1},$$

where $C_{gd,M1}$ is capacitance between the gate and drain of M1, and $C_{gs,M1}$ is the capacitance between the gate and source of M1. In the region where the output voltage is changing, $V_G$ will be fairly constant due to the gain of M1.

The slew rate of the output voltage $V_{OUT}$ is given by $$dV_{OUT}/dt = I_S/(C1+C_{gd,M1}), \text{ or}$$

$$dV_{OUT}/dt = K_S \cdot Iref/(C1+C_{gd,M1}),$$

where $K_S$ is the mirror ratio $(W/L)_{M4}/(W/L)_{M2}$. So the slew rate can be controlled by setting one or more of Iref, $K_S$ and C1. Note that current gain from M2 to M6 can be different than from M2 to M4, enabling different slew rates for $V_{OUT}$ rising and $V_{OUT}$ falling. In FIG. 3, the ratio W/L of the transistor M2 could be increased to obtain a lower slew rate. (In general, for any given MOS transistor, W is channel width, and L is channel length.)

It should be noted that the above expressions for $dV_{OUT}/dt$ imply that C1 is not required to achieve a slew rate in $V_{OUT}$. Indeed, in some embodiments, the capacitor C1 is omitted.

Figure 4:
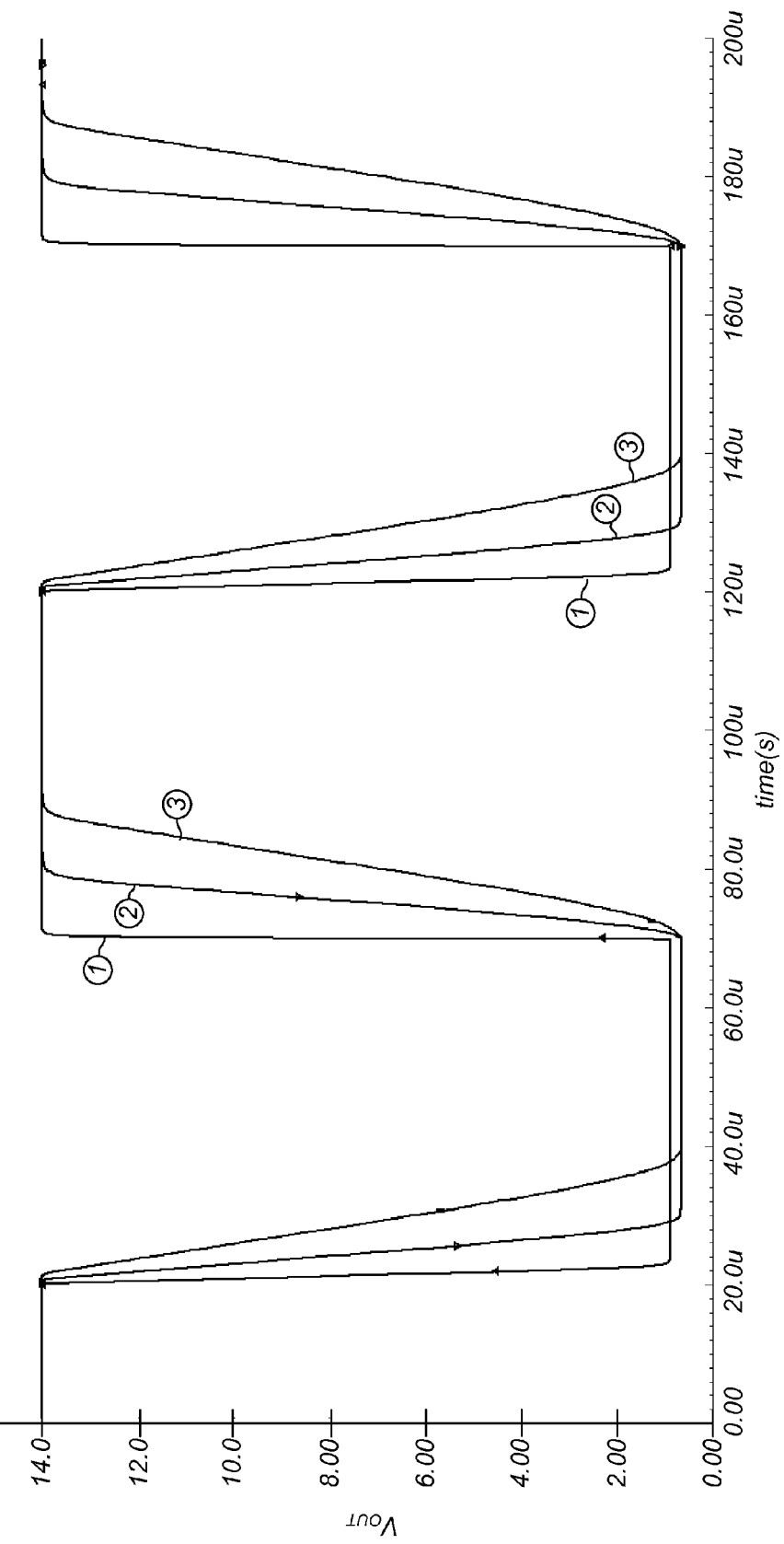
FIG. 4 shows the results of a simulation of the driver circuit embodiment of FIG. 3.

FIG. 4 shows the results of a simulation of the slew rate limited driver of circuit 300, compared to the unlimited driver of FIG. 1A. The output voltage signal is shown for two different values of the current Iref in FIG. 3. The simulation used the following parameter values: C1=2 pF, $(W/L)_{M1}$=1400/1.7. The excellent symmetry of the slew rate between rising edges and falling edges can be seen.

Vdrive is set to a voltage appropriate to turn on M1. For example, Vdrive may be the same as VSUP. Increasing Vdrive will allow more current to flow in M1, but will also increase propagation delay for the rising edges of $V_{OUT}$.

Figure 5:
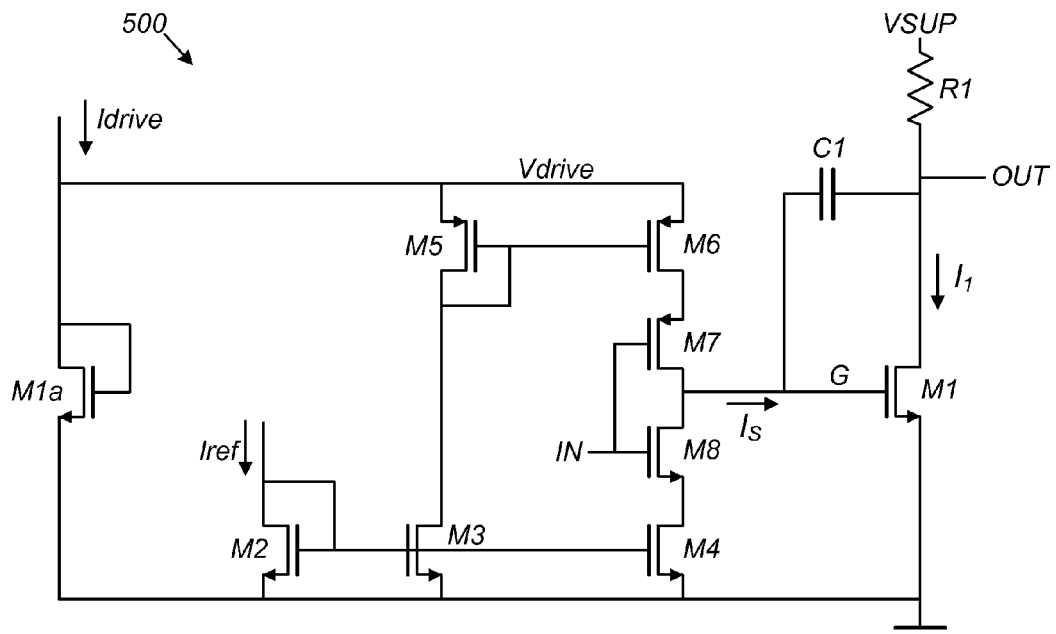
FIG. 5 shows one embodiment of a driver circuit that limits both slew rate and output current.

FIG. 5 shows a driver circuit 500 that provides slew rate control along with control of the maximum output current, i.e., the maximum current through output transistor M1. The current $I_1$ through M1 will attain its maximum value when the output is driven low and $V_G$=Vdrive. If Vdrive is created by letting a known current Idrive flow through a diode-connected transistor M1a as shown in FIG. 5, then M1 and M1a will act as a current mirror, and the current $I_1$ will be limited to N·Idrive:

$$I_{1,max} = \text{Max}\{I_1(t)\} = N \cdot \text{Idrive},$$

where N is a real-valued parameter given by $$N = (W/L)_{M1}/(W/L)_{M1a}.$$

Another improvement to the driver circuit can be achieved by making the maximum output current depend on $V_{OUT}$, such that $I_{1,max}$ becomes smaller for increasing $V_{OUT}$. In this fashion, the power dissipation in the output device M1 is reduced, while still maintaining a strong drive current when $V_{OUT}$ is low. This feature is especially helpful to reduce the short-circuit current in the case when the output (OUT) is shorted to VSUP. (For example, the output might be shorted to VSUP if the output is a wire running through an automobile. The wire may be damaged and touch another wire corresponding to VSUP.)

Figure 6A:
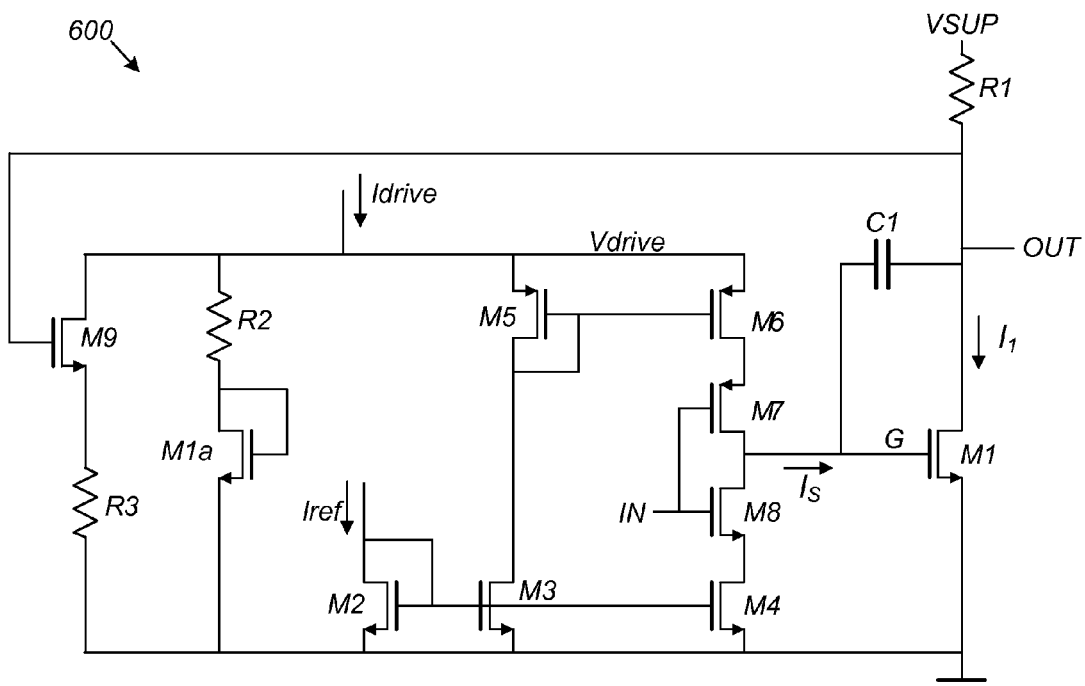
FIG. 6A shows one embodiment of a driver circuit that limits slew rate and limits output current as a function of output voltage.

FIG. 6A shows a driver circuit 600 where Vdrive is reduced as $V_{OUT}$ increases. Because $V_{OUT}$ couples to the gate of transistor M9, transistor M9 consumes a portion of the current Idrive, i.e., a portion that would otherwise flow through transistor M1a. The amount of current through M9 is based on the value of $V_{OUT}$. The amount of decrease in voltage Vdrive can be adjusted with resistor R3. The resistor R2 is optional and can be used to increase the level of Vdrive for low levels of $V_{OUT}$.

One embodiment of the driver circuit 600 has been implemented in the LIN transceiver of the MPM85000 Automotive Power Management chip supplied by SMSC. LIN is an acronym for Local Interconnect Network (used in automotive networking).

Figure 6B:
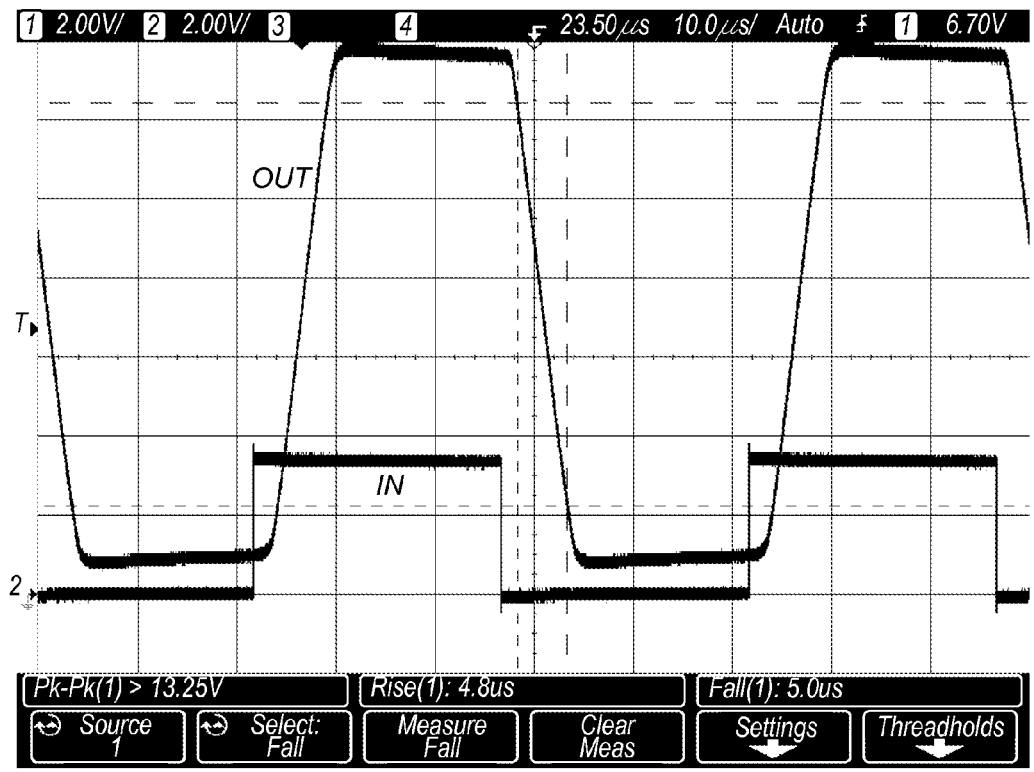
FIGS. 6B and 6C shows measured waveforms $V_{IN}$ and $V_{OUT}$ from one embodiment of driver circuit 300 (FIG. 3).
Figure 6C:
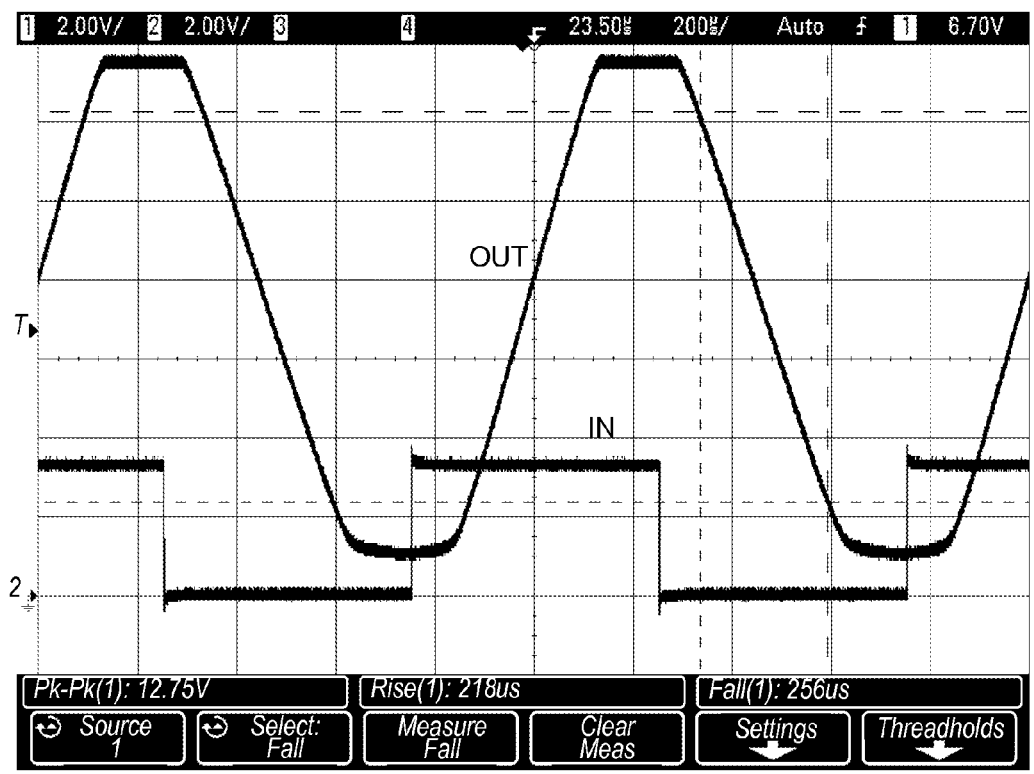

Measured waveforms for $V_{IN}$ and $V_{OUT}$ are shown in FIGS. 6B and 6C. FIG. 6B shows a case where Iref has been set to a value $I_A$=6.8 microamps in order to achieve a given slew rate. FIG. 6C shows a case were Iref has been set to a smaller value $I_B$=0.5 microamps in order to give a smaller slew rate.

Any of a wide variety of desired I-V characteristics may be achieved by appropriate modification of the driver circuit.

Figure 7:
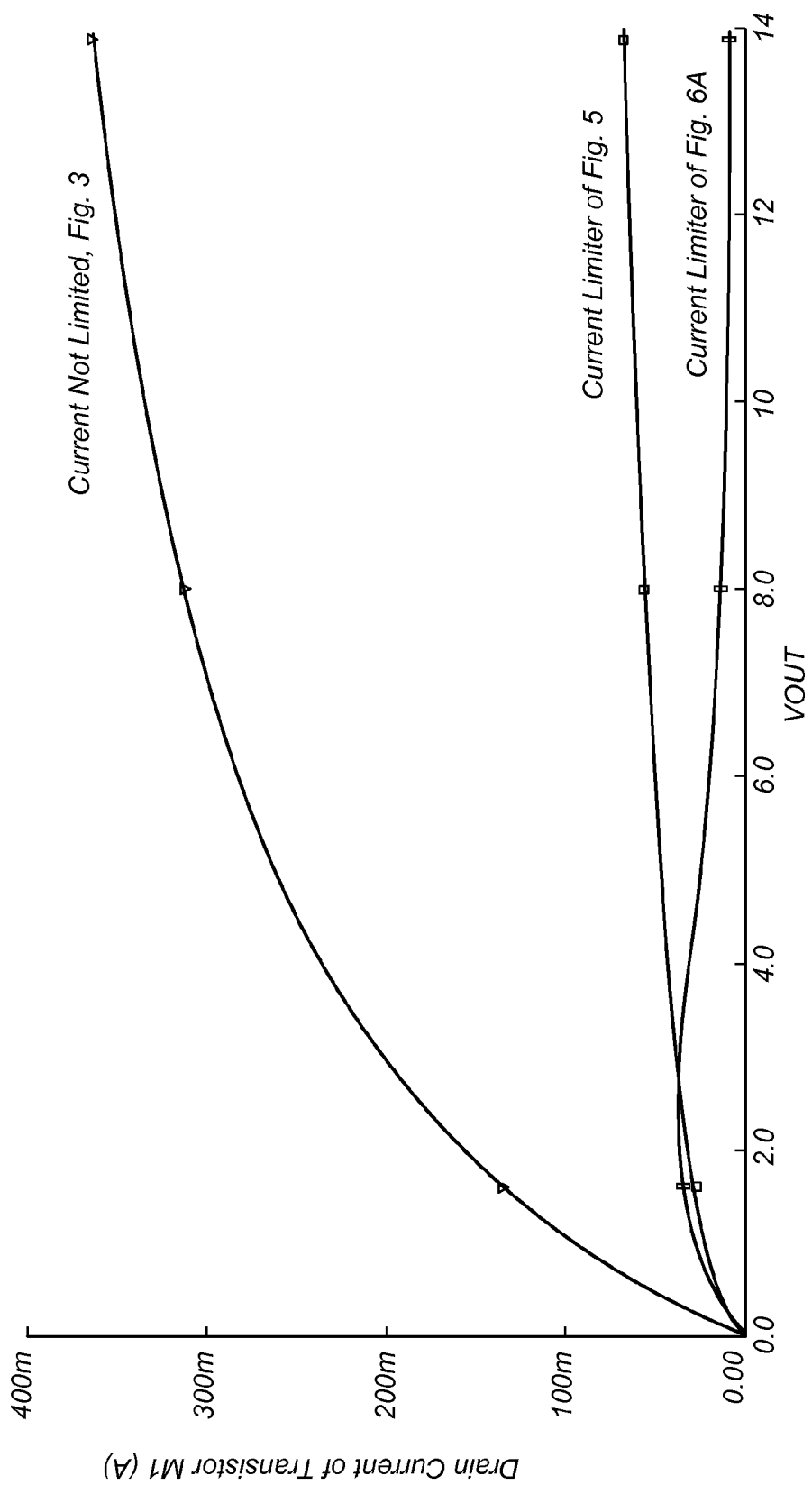
FIG. 7 shows curves of output current versus output voltage for circuit 300, circuit 500 and circuit 600.

FIG. 7 shows simulation results for the driver circuits 300, 500 and 600. A curve of output current versus output voltage $V_{OUT}$ is shown for each of the circuits. (The curve for driver circuit 300 is labeled "current not limited".)

Figure 8:
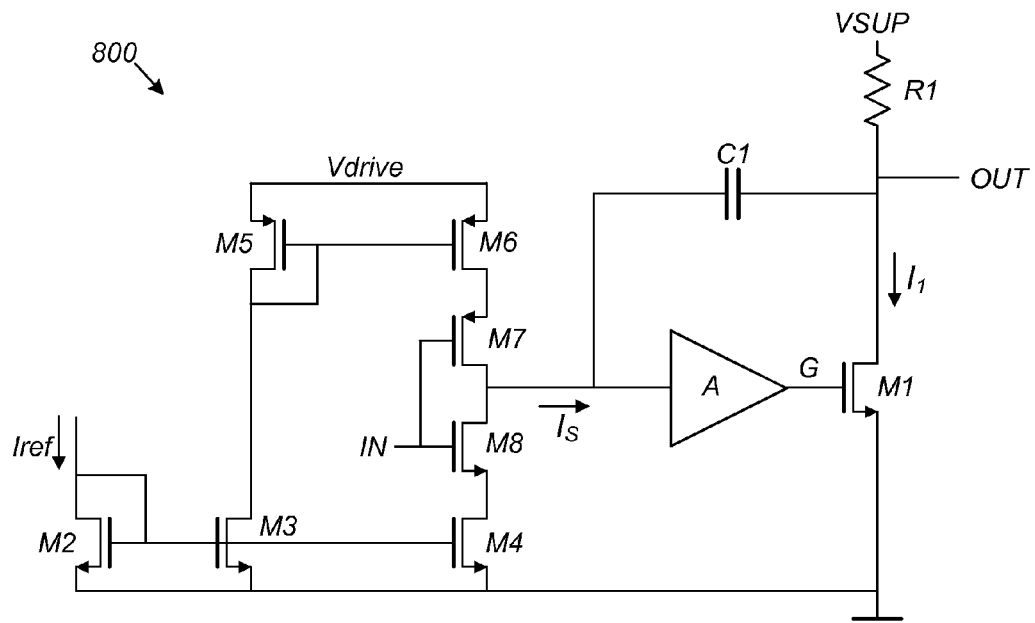
FIG. 8 shows one embodiment of a driver circuit than includes an amplifier between the current generator output and the gate of the output transistor.

FIG. 8 shows a driver circuit 800 incorporating a further improvement to the slew rate control. An amplifier with gain A is inserted at the gate of the output transistor M1, and thus, the current generator (i.e., the subcircuit that provides current $I_S$) does not see the large gate capacitance of the output transistor M1 any more. The amplifier has sufficiently high input impedance that it is safe to assume the entire current $I_S$ flows through capacitor C1. One advantage of driver circuit 800 is that the slew rate of the output voltage is now independent of the gate capacitance of the output transistor. The slew rate of the output voltage is determined by C1, $K_S$ and $I_S$, and can be made much more accurate and independent of the size of the output transistor M1. In particular, the slew rate $$dV_{OUT}/dt = K_S \cdot Iref/C1,$$

where $K_S$ is the mirror ratio $I_S$/Iref.

Another advantage of driver circuit 800 is that the response time of the driver circuit has become much shorter since the current generator does not have to charge up the large load capacitance of the output transistor M1. The propagation delay of a driver circuit is an important specification, which is usually difficult to combine with a slew rate spec.

The exact value of the gain A is not critical since the output device M1 will normally have sufficient gain $A_{M1}=dV_{OUT}/dV_G$. However, the amplifier should have high input impedance and low output impedance in order to drive the large output transistor nimbly.

Figure 9:
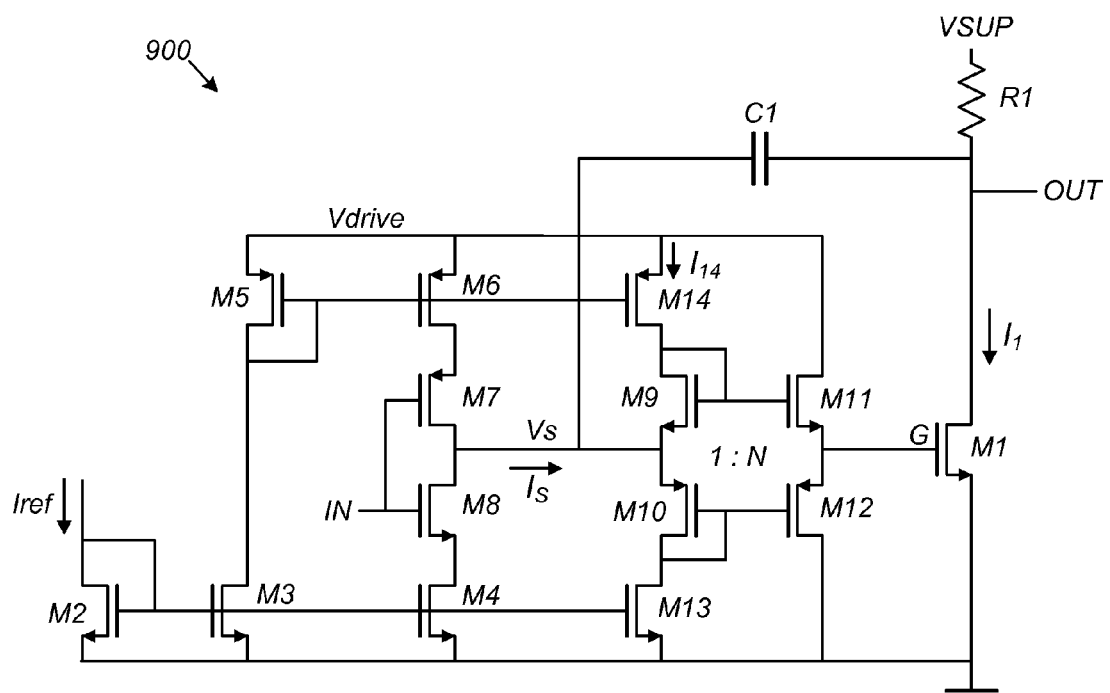
FIG. 9 shows one embodiment of the driver circuit 800 where the amplifier is realized using a diamond follower circuit.

FIG. 9 shows an embodiment 900 of the improved slew-rate-controlled driver 800, where the amplifier is realized by a diamond follower circuit including transistors M9, M10, M11, M12, M13 and M14.

The diamond follower circuit has high speed, low output impedance and unity gain (i.e., voltage gain equal to one).

The diamond follower is biased by transistors M13 and M14, which are set to the same drain current. The bias current $I_{14}$ is set to a current which is a fraction of $I_S$ in order to ensure a reasonable accuracy of $I_S$ when M13 or M14 leave the saturation region. This might happen when $V_S$ approaches either GND or Vdrive. In that case the drain currents of M13 and M14 will not be equal any more.

Preferably, transistors M11 and M12 should be matched respectively to transistors M9 and M10. In other words, the ratios $N_{11}$ and $N_{12}$ defined by the following expressions are preferably equal:

$$N_{11} = (W/L)_{M11}/(W/L)_{M9},$$

$$N_{12} = (W/L)_{M12}/(W/L)_{M10}.$$

However, in some embodiments $N_{11}$ and $N_{12}$ are different. If $N_{11}$ and $N_{12}$ are different, slew rate control will still be achieved.

Figure 10:
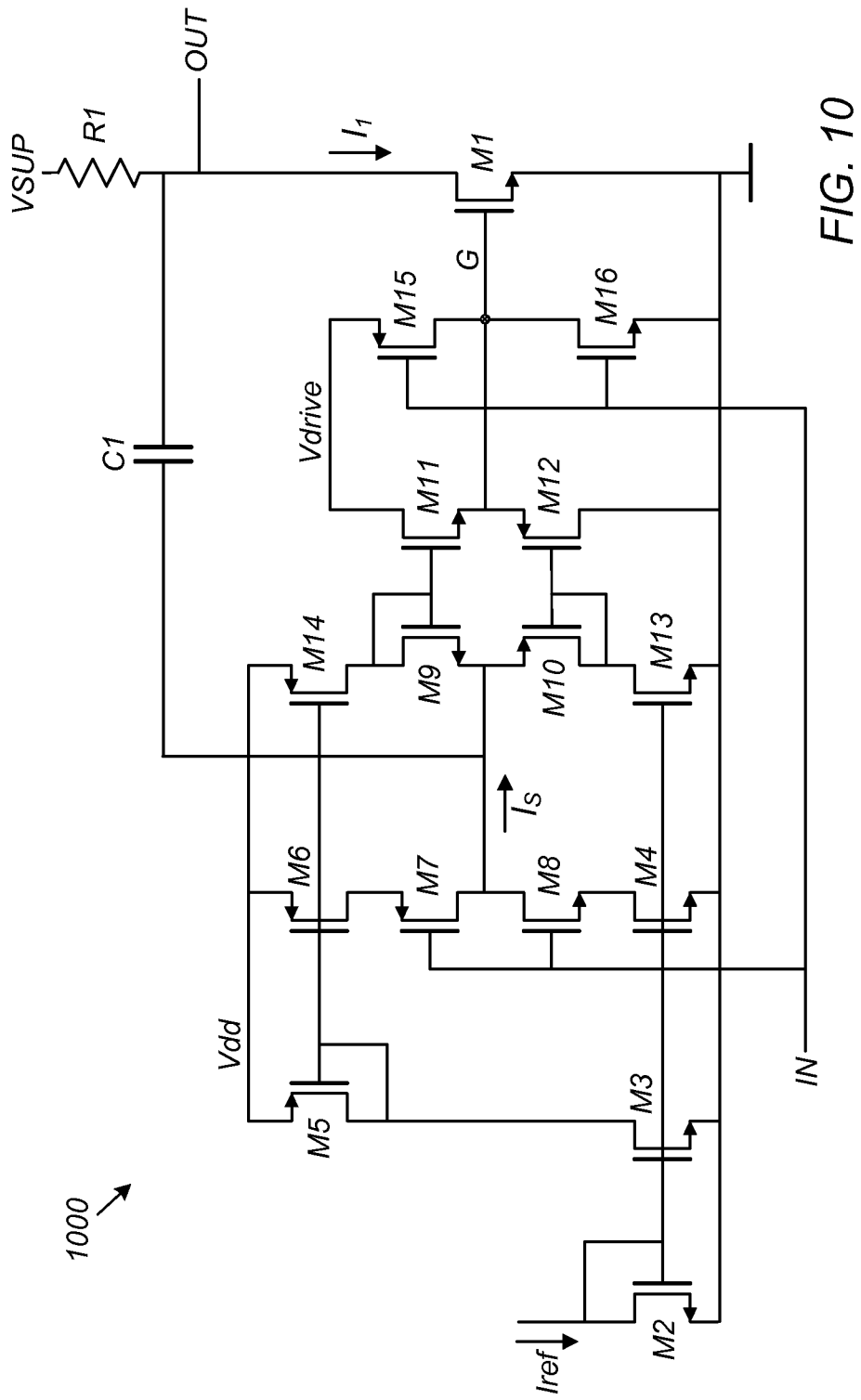
FIG. 10 shows one embodiment of the driver circuit 800 where an input stage and output stage are driver by different supply voltages. The input stage is coupled to the same supply as the current generator.

Even with the improved slew rate control, it is still possible to limit output current and to control the I-V characteristic of the driver circuit, e.g., as shown in FIG. 10. Here the maximum voltage at the gate G of the output device M1 is independent of the supply voltage Vdd of the current generator. (The maximum voltage at the gate G is equal to Vdrive.)

Transistor M11 can drive the gate of M1 only to the voltage Vdrive, which limits the maximum drain current of M1. Vdrive can be generated as in FIG. 5, i.e., by letting a known current Idrive flow through a diode-connected transistor M1a, where the drain of the transistor M1a is coupled to the node Vdrive. (A transistor is said to be diode-connected when its gate is coupled to its drain.) Alternatively, Vdrive can be generated as in FIG. 6A using transistors M9 and M1a. Thus, the shape of the I-V curve of the output can be controlled by making Vdrive dependent on $V_{OUT}$.

The transistors M15 and M16 are optional. They are weak devices that allow the voltage $V_G$ to be driven closer to the rails Vdrive and GND. The source followers M11 and M12 can drive a large current to the node G, but are not capable of driving $V_G$ closer to the rails than within a few 100 mV.

Figure 11:
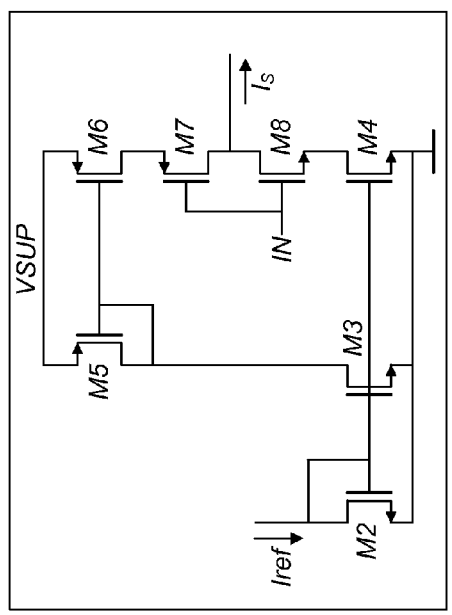
FIG. 11 shows one embodiment of a current generator and a graphical notation for the current generator.

Let the current generator be represented by the graphical notation shown in FIG. 11.

Figure 12:
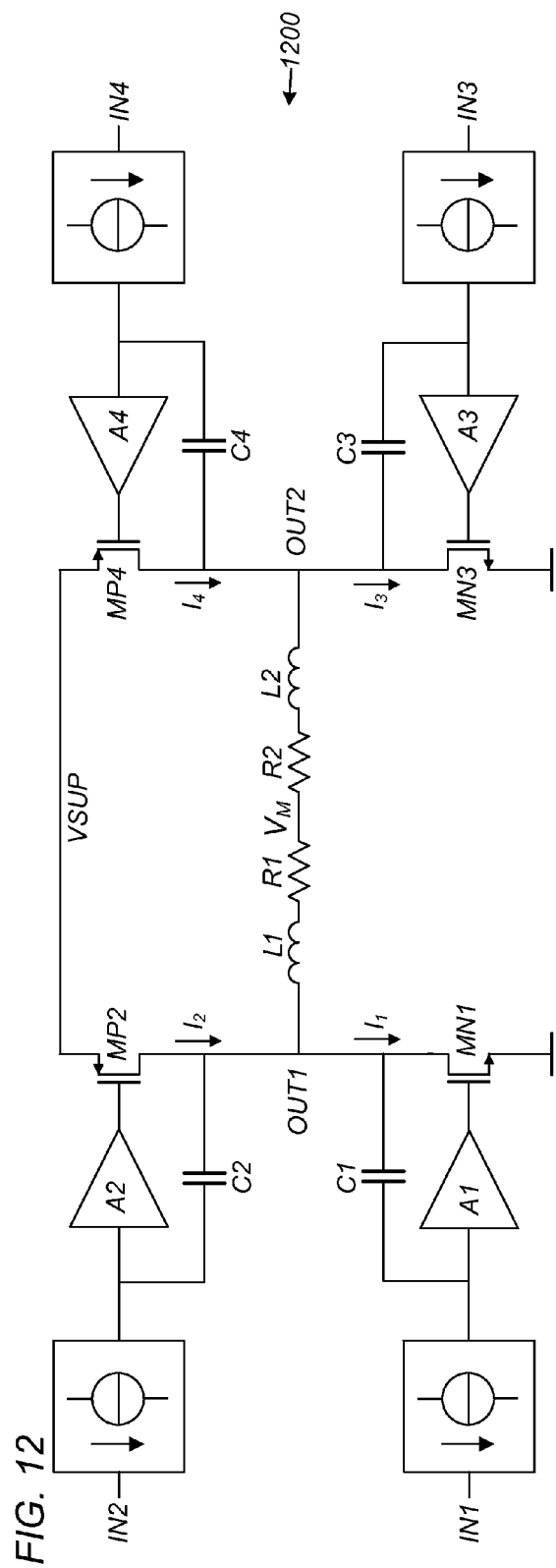
FIG. 12 shows one embodiment of a fan driver including four driver circuits arranged in a H-bridge topology.

FIG. 12 shows a bridge driver circuit 1200 that may be used to drive a fan. The driver 1200 has a bridge topology that includes four driver circuits. Each driver circuit includes a current generator, an amplifier, a capacitor and an output transistor as illustrated. The output transistor is either a PMOS transistor or an NMOS transistor. In one embodiment, MN1 and MN3 are NMOS transistors; and MP2 and MP4 are PMOS transistors. In another embodiment, MN1-MN4 are all NMOS transistors. In yet another embodiment, MN1-MN4 are all PMOS transistors.

The fan is represented by a load comprising a series combination of inductance L1, resistance R1, resistance R2 and inductance L2. The mid-point node $V_M$ of the load may be interpreted as the common wire of a 3-phase fan.

Figure 13:
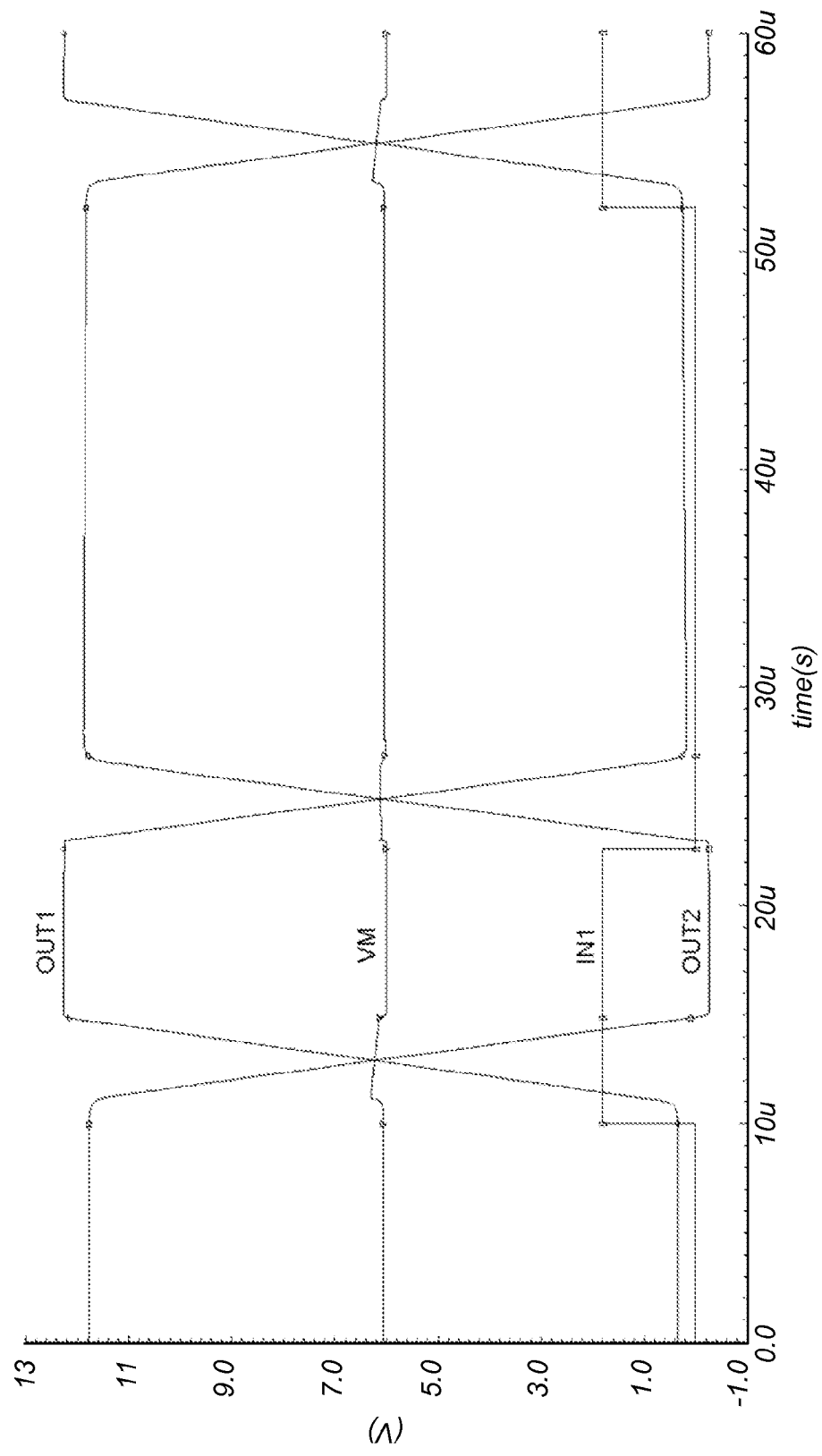
FIG. 13 shown simulation results for the fan driver of FIG. 12.

The load is driven by alternating between two activation patterns: (MN1=ON, MP2=OFF, MN3=OFF, MP4=ON) and (MN1=OFF, MP2=ON, MN3=ON, MP4=OFF). In the first activation pattern, current $I_4$ flows through the load and equals current $I_1$. In the second activation pattern, current $I_2$ flows through the load and equals current $I_3$. Because of the quick response of the four driver circuits, MN1 and MP4 turn on almost at the same time, resulting in only a small disturbance of the midpoint voltage $V_M$. Similarly with MP2 and MN3. See FIG. 13 for a simulated result.

Figure 14:
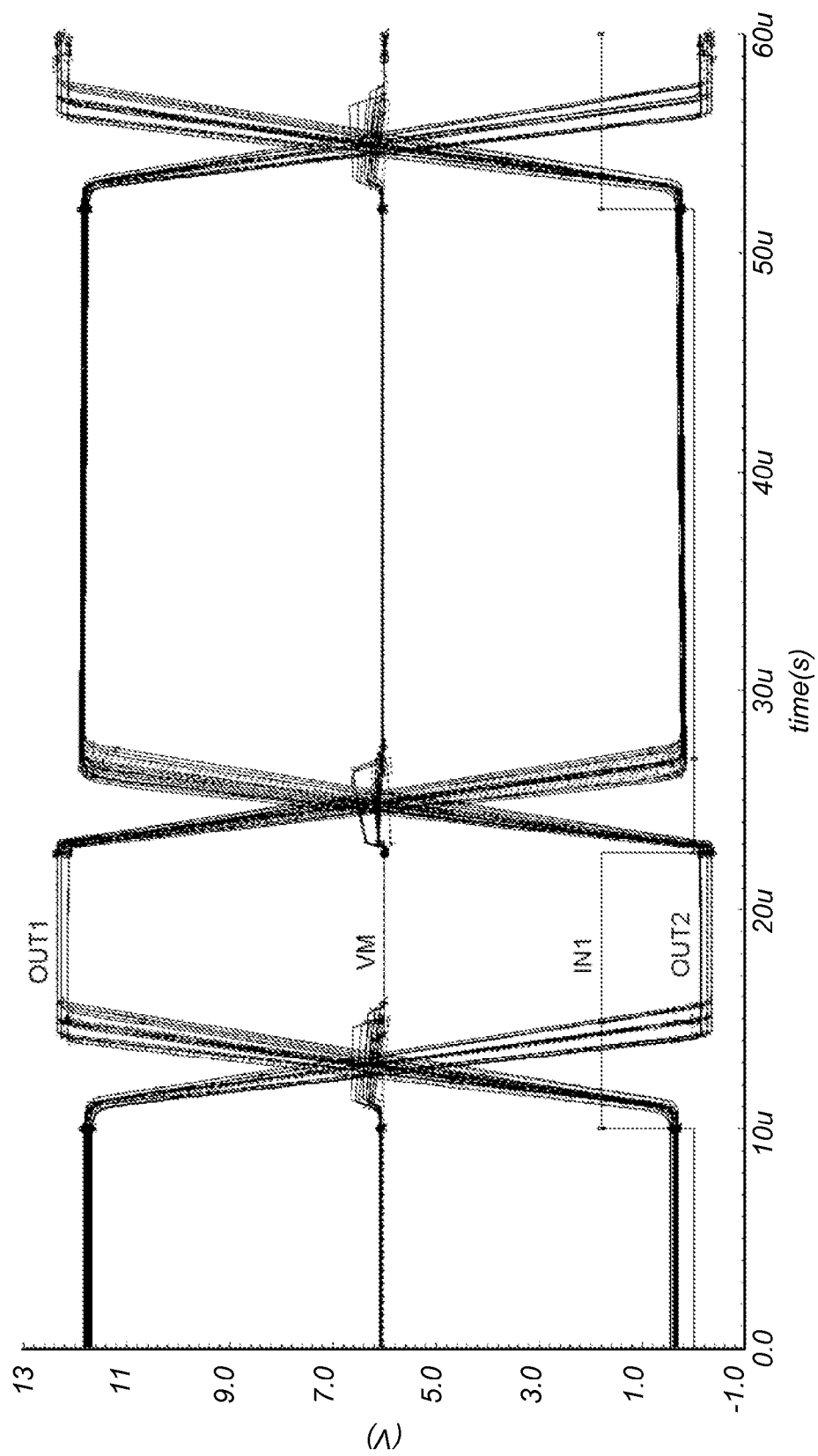
FIG. 14 shows a simulation of PVT corner cases on the fan driver of FIG. 12.

FIG. 14 shows simulation results for driver 1200 across variations in process and temperature. The robustness and stability of the fan driver 1200 are exhibited in the tight clustering of the signal waveforms. The parameters for the corners cases were: all combinations of nominal, slow and fast of all NMOS transistors and PMOS transistors, and temperatures −40, 27 and 125 degrees C. The supply voltage VSUP was 12 Volts for all cases.

In one set of embodiments, a bridge driver device may include four driver circuits coupled in an H-bridge topology (e.g., as shown in FIG. 12). Each of the four driver circuits may include: a current generator and an output transistor, where the current generator has an input port, an output port and reference port, where the output port of the current generator is coupled to the gate of the output transistor, where the current generator is configured to control a first current flowing through the output port based on an input voltage appearing at the input port, where the current generator is configured to limit the absolute value of the first current to be less than or equal to a maximum that is determined by a reference current provided at the reference port.

In one embodiment, the output transistors of a first and second of the four driver circuits are PMOS transistors, where the output transistors of a third and fourth of the four driver circuits are NMOS transistors. In another embodiment, the output transistors are all of the same type, e.g., all NMOS or all PMOS.

An H-bridge is a circuit that enables a voltage and/or current to be applied across a load in either direction. The load takes the position of the horizontal link between the two vertical members of the H structure.

In some embodiments, each of the four driver circuits also includes a capacitor that couples between a gate of the corresponding output transistor and a drain of the corresponding output transistor.

In some embodiments, the bridge driver device also includes a fan as a load device of the H-bridge topology.

Various advantages may follow from employing the design principles herein described. For example, in some embodiments, the following combination of advantages may be realized. (1) The maximum driver current can be limited independent of the driver slew rate. (2) The slew rate control is simple and requires only a few small on-chip components. (3) A large range of slew rates can be obtained at the cost of very little layout area. Very low slew rates can be realized by reducing the gate current $I_S$. (4) The resulting slew rate is independent of the load at the driver output to a large extent. (5) A very good symmetry between rising and falling edges can be obtained with this method. (6) The maximum output current can be made smaller for increasing $V_{OUT}$, thereby reducing the power dissipation of the output transistor, while maintaining the strength of the driver when $V_{OUT}$ is low.

In some embodiments, e.g., embodiments with the gain stage at the driver gate, the following additional advantages may be realized: (1) Accurate slew rate control; (2) Slew rate is independent of gate capacitance of the output transistor; (3) Fast response time from input pulse to slewing output; (4) Good correspondence in propagation delay of PMOS and NMOS drivers, useful for symmetrical drive of a load (for example a fan coil) in a bridge driver topology; (5) The driver circuits disclosed herein may be used in any of various applications. For example, they may be used to implement output drivers, bus drivers, line drivers and logic output drivers.

Figure 15:
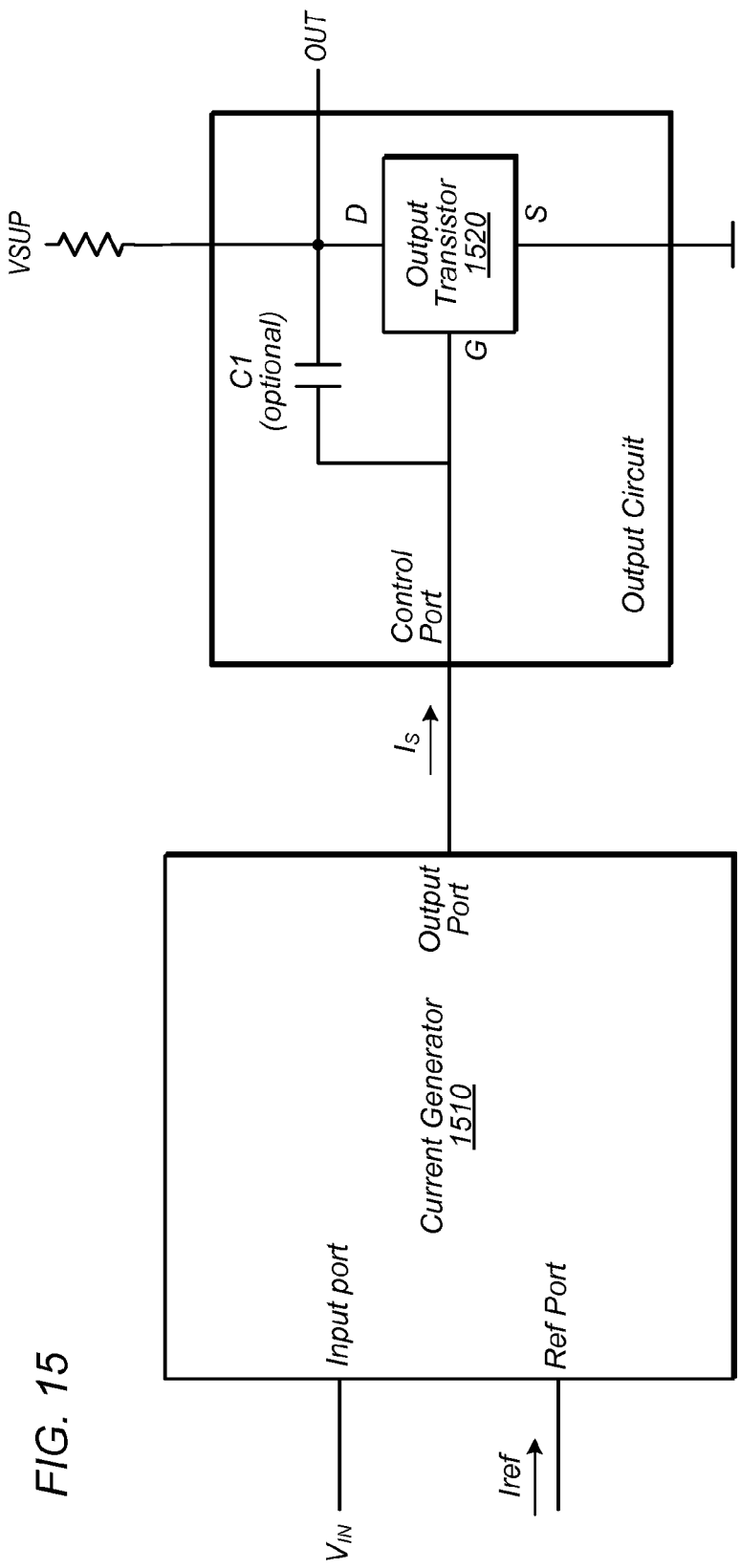
FIG. 15 shows one embodiment of a driver circuit including a current generator, an output device and a capacitor.

In one set of embodiments, a driver circuit 1500 may be configured as shown in FIG. 15. Driver circuit 1500 may include a current generator 1510, an output transistor 1520, and optionally, a capacitor C1. The current generator may be configured as described above. The output transistor 1520 may be a PMOS transistor or an NMOS transistor. If present, the capacitor C1 may be coupled between the output port of the current generator and the drain D of the output transistor. (As noted above, a slew rate may also be obtained without using capacitor C1.)

The current generator 1510 has an input port, an output port and a reference port. A reference current Iref is provided to the reference port. An input voltage $V_{IN}$ is provided to the input port. The output port is coupled to the gate G of the output transistor 1520. The current generator is configured to control a current $I_S$ flowing through the output port based on the input voltage $V_{IN}$. The current generator is configured to limit the absolute value of the current $I_S$ to be less than or equal to a maximum that is determined by the reference current Iref provided at the reference port.

In some embodiments, the current generator may include: a transistor A; a first chain of transistors; and a second chain of transistors. (One such embodiment is shown in FIG. 11, where the transistor A is transistor M2, where the first chain includes transistors M5 and M3, and the second chain includes transistors M6, M7, M8 and M4.) The first chain and the second chain may be coupled in parallel between a drive voltage and ground. The first transistor of the first chain may be coupled to form a current mirror with a first transistor of the second chain. The transistor A may be configured to form a current mirror with a last transistor of the first chain. The transistor A may also be configured to form a current mirror with a last transistor of the second chain. The reference current Iref may be provided to the drain of the transistor A. The input port (of the current generator) may be coupled to the gates of the second and third transistors in the second chain. The second and third transistors of the second chain may be coupled to a common node in drain-to-drain fashion. The common node may be coupled to the output port of the current generator.

In some embodiments, the driver circuit also includes a transistor B coupled to a drive voltage node of the current generator. The gate and drain of the transistor B may be connected together; the drive voltage node may be driven with a known current Idrive. One such embodiment is shown in FIG. 5, where transistor M1$a$ takes the role of transistor B.

In addition to the transistor B as described above, the driver circuit may also include a transistor C. (See, e.g., FIG. 6A, where transistor M9 takes the role of the transistor C.) The gate of the transistor C may be coupled to the drain of the output transistor 1520. The drain of the transistor C may be coupled to the drive voltage node of the current generator. The source of the transistor C may be coupled to ground through a first resistor. Furthermore, the transistor A may be coupled to the drive voltage node through second resistor. (See, e.g., the resistor R2 of FIG. 6A.) However, in some embodiments, the second resistor is replaced with a conductive line.

In some embodiments, the output port of the current generator may be coupled to the gate of the output transistor through an amplifier, e.g., as shown in FIG. 8.

In some embodiments, the amplifier has an input impedance sufficiently high to guarantee that a significant portion of the current $I_S$ flows through the capacitor. Higher input impedance implies a larger percentage of the current $I_S$ flowing through the capacitor, and thus, better results.

In some embodiments, the amplifier includes a diamond follower circuit, e.g., as shown in FIG. 9.

In some embodiments, the amplifier may include an input stage and an output stage that are coupled together. For example, in FIG. 9, the input stage is the subcircuit including transistors M14, M9, M10 and M13; the output stage is the subcircuit including transistors M11 and M12. The input stage may be coupled between a voltage node Vdd and ground. A supply voltage node of the current generator may be coupled to the voltage node Vdd. The output stage may be coupled between a voltage node Vdrive and ground.

In some embodiments, the voltage Vdrive may be generated by sending a current Idrive through a diode-connected transistor as described above. In other words, a transistor B may have its drain coupled to the voltage node Vdrive, its drain and gate shorted together, and its source coupled to ground. A current Idrive is made to flow through the transistor B, e.g., by coupling a current source to the voltage node Vdrive. The current source injects the current Idrive into the voltage node Vdrive.

In some embodiments, a driver circuit for controlling output slew rate may include a current generator and an output transistor, e.g., as would result from removing the capacitor C1 from the circuit of FIG. 15, or, from removing the capacitor C1 from FIG. 3. The current generator may include an input port, an output port and a reference port. The output port of the current generator may be coupled to the gate of the output transistor. The source of the output transistor may be coupled to ground. The current generator may be configured to control a current $I_S$ flowing through the output port based on an input voltage appearing at the input port. The current generator may be configured to limit the absolute value of the current $I_S$ to be less than or equal to a maximum that is determined by a reference current Iref provided at the reference port.

Similarly, alternative embodiments of the circuits shown in FIGS. 5 and 6A are contemplated, where the capacitor C1 is removed. Even with this removal, the driver circuits can still provide a measure of slew rate control because of the capacitance intrinsic to the transistor M1.

In some embodiments, the current generator may include transistors M2, M3, M4, M5, M6, M7 and M8, where transistors M5 and M3 are coupled to a form a first series between a drive voltage and ground, where transistors M6, M7, M8 and M4 are coupled to form a second series between the drive voltage and ground, where transistors M2 and M3 are coupled to form a first current mirror, where transistors M2 and M4 are coupled to form a second current mirror, where transistors M5 and M6 are coupled to form a third current mirror, where the input port is coupled to the gates of transistors M7 and M8, where the output port is coupled to the drains of transistors M7 and M8. One such current generator is shown in FIG. 11.

In one set of embodiments, a current generator circuit may include: an input port, an output port, reference port, a first transistor, a second transistor, a third transistor, a fourth transistor, a fifth transistor, a sixth transistor and a seventh transistor. (One such embodiment is shown in FIG. 11.) The second and third transistors may be coupled to a form a first series between a drive voltage and ground. The fourth, fifth, sixth and seventh transistors may be coupled to form a second series between the drive voltage and ground. The first and third transistors may be coupled to form a first current mirror. The first and seventh transistors may be coupled to form a second current mirror. The second and fourth transistors may be coupled to form a third current mirror. The input port may be coupled to gates of the fifth and sixth transistors. The output port may be coupled to drains of the fifth and sixth transistors. The reference port may be coupled to the drain and gate of the first transistor. The fifth and sixth transistors may comprise one PMOS transistor and one NMOS transistor.

In some embodiments, the second and third transistors may comprise one PMOS transistor and one NMOS transistor.

In some embodiments, the reference port may be supplied with a constant reference current.

In some embodiments, the second, fourth and fifth transistors are PMOS transistors; and the first, third, sixth and seventh transistors are NMOS transistors.

Figure 16:
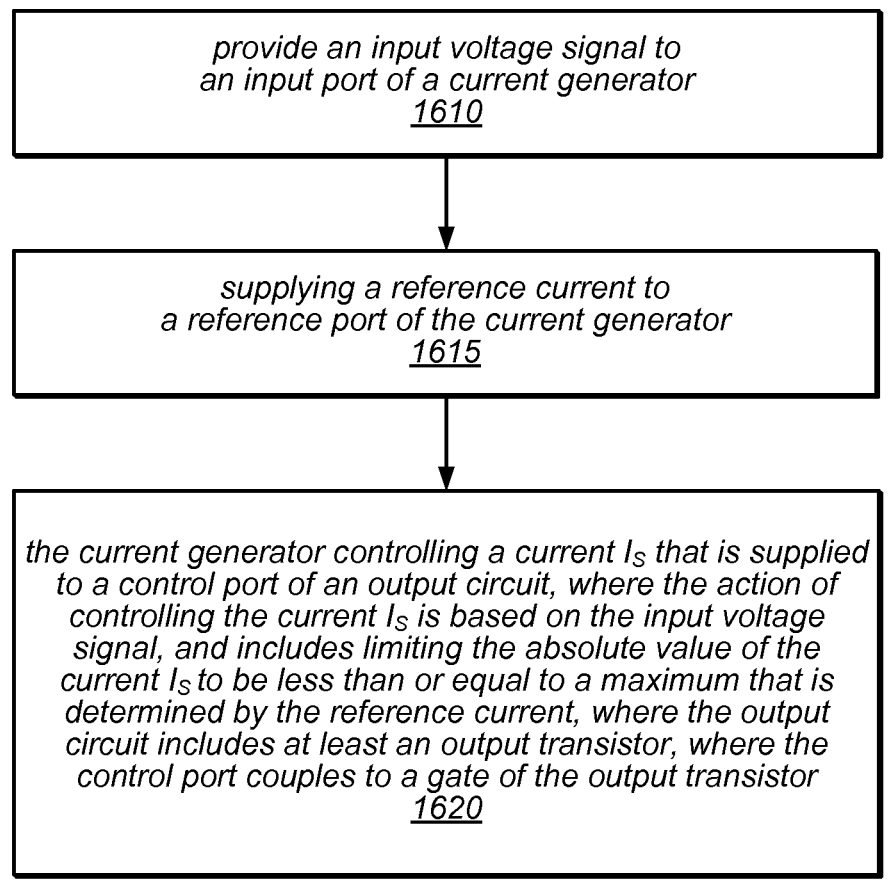
FIG. 16 illustrates one embodiment of a method for controlling the output slew rate of a driver circuit.

In one set of embodiments, a method 1600 for controlling the output slew rate of a driver circuit may include the following operations, as shown in FIG. 16.

At 1610, an input voltage signal may be provided to an input port of a current generator.

At 1615, a reference current may be supplied to a reference port of the current generator.

At 1620, a current generator may control a current $I_S$ that is supplied to a control port of an output circuit, e.g., as shown in FIG. 3 or FIG. 15. The action of controlling the current $I_S$ is based on the input voltage signal, and includes limiting the absolute value of the current $I_S$ to be less than or equal to a maximum value that is determined by the reference current Iref. The output circuit includes at least an output transistor (and may also include a capacitor that couples between the control port and the drain of the output transistor). The control port couples to the gate of the output transistor.

In some embodiments, the action of controlling the current $I_S$ may include opening a first channel that couples to a first transistor and closing a second channel that couples to a second transistor in response to the input voltage signal transitioning to a high state. The first transistor couples to ground, and the current through the first transistor is limited to be less than or equal to said maximum value. For example, in FIG. 1, the first channel is the channel of transistor M8; the first transistor is transistor M4; the second channel is the channel of transistor M7; and the second transistor is the transistor M6, e.g., by a current mirror structure as described variously above.

The action of controlling the current $I_S$ may also include opening the second channel and closing the first channel in response to the input voltage signal transitioning to a low state. The second transistor couples to a drive voltage. The current through the second transistor is limited to be less than or equal to said maximum value, e.g., by another current mirror structure as described variously above.

In some embodiments, the method 1600 may also include supplying a known drive current to a transistor M1a, e.g., as shown in FIG. 5. The drain and gate of the transistor M1a are coupled together. The drain of the transistor M1a is coupled to a drive voltage node of the current generator. In one such embodiment, the method 1600 also includes controlling a transistor M9 based on a drain voltage of the output transistor, e.g., as shown in FIG. 6A. The drain voltage of the output transistor controls a gate voltage of the transistor M9. The transistor M9 couples to ground through a resistor R3. The transistor M1a may couple to the drive voltage node through a resistor R2.

In some embodiments, said coupling between the control port of the output device and the gate of the output transistor is through an amplifier, e.g., as variously described above.

In some embodiments, the method 1600 may also include: supplying the current generator with a first supply voltage; and supplying a known drive current to transistor M1a, where the drain and gate of the transistor M1a are coupled together, where the drain of the transistor M1a is coupled to a drive voltage node of the amplifier.

In some embodiments, a data structure characterizing any of the circuits described herein may be stored on a computer accessible memory medium. The data structure may be a database which can be read by a program and used, directly or indirectly, to fabricate the hardware comprising the circuit. For example, the data structure may include a description of the circuit in a hardware description language.

A memory medium is any medium that is configured to store information.

A computer accessible memory medium is a memory medium that stores data and/or program instruction in a manner that is accessible by a computer.

Figure 17:
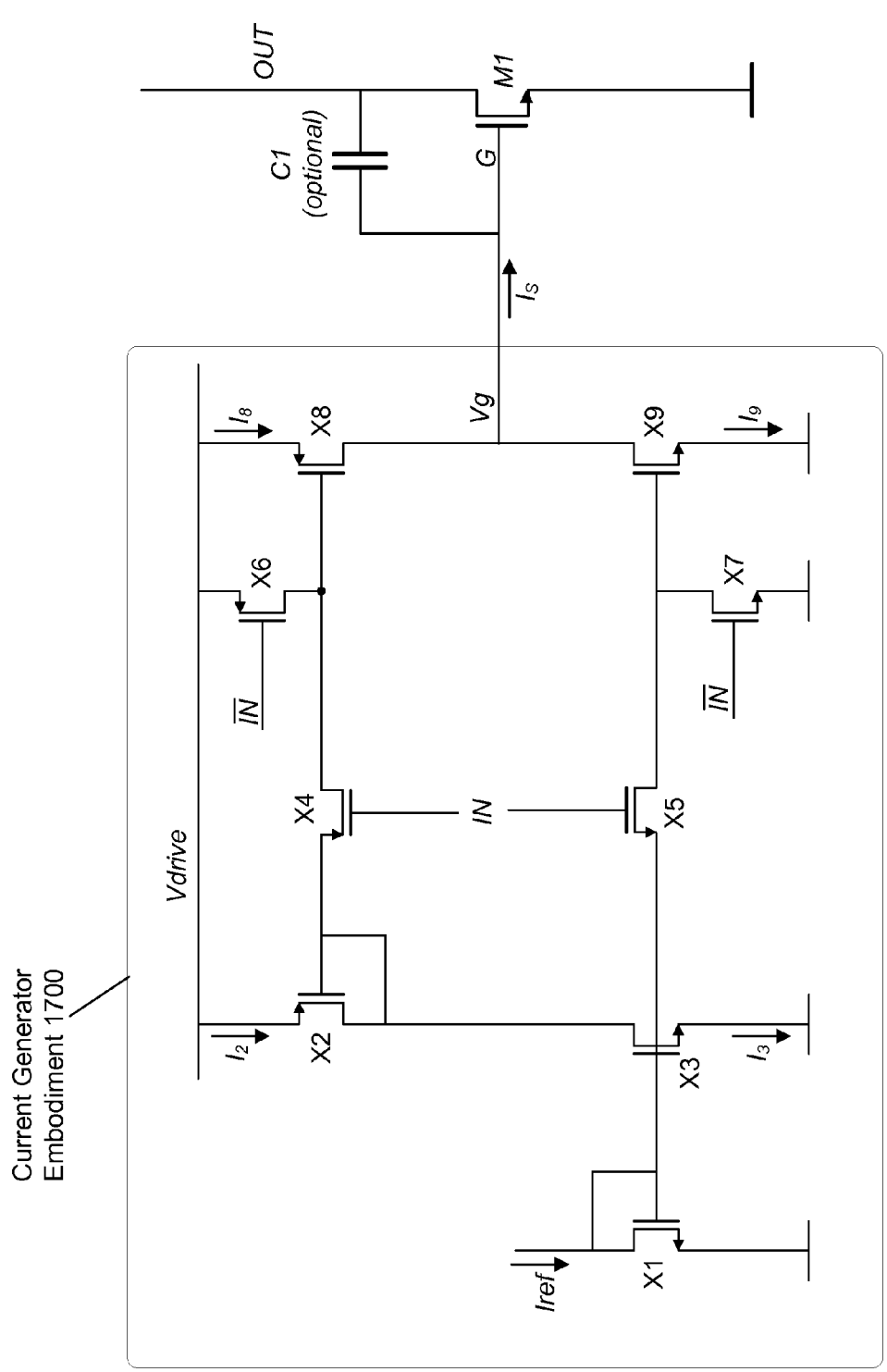
FIG. 17 illustrates an alternative circuit embodiment for the current generator.

FIG. 17 illustrates an alternative circuit embodiment 1700 for the current generator, i.e., as an alternative to the circuit embodiment of FIG. 11. Embodiment 1700 includes transistors X1 through X9. When the input IN is low, transistor X4 is on; transistor X6 is off; transistor X5 is off; and transistor X7 is on. Thus, the gate of transistor X9 is at ground potential; transistor X9 is off; and the output port is at the drive voltage Vdrive.

When the input transitions from low to high, transistor X4 turns off; transistor X6 turns on; transistor X5 turns on; and transistor X7 turns off. Thus, the gate voltage of transistor X8 transitions to the drive voltage Vdrive; transistor X8 turns off; the current $I_S$ through the output port is constrained to be equal to the negative of the current $I_9$ through transistor X9; the current $I_9$ is constrained to be less than or equal to a maximum value that is proportional to the current Iref through transistor X1, due to the current mirror relationship that currently exists between X1 and X9. The current $I_S$ charges the gate-drain capacitance of the output transistor M1 as well as capacitor C1 until the voltage at the output port equals zero (ground potential).

When the input transitions from high to low, transistor X4 turns on; transistor X6 turns off; transistor X5 turns off; and transistor X7 turns on. Thus, the current mirror relationship between X1 and X9 is disabled; a new current mirror relationship between X2 and X8 is enabled; the gate voltage of transistor X9 transitions to ground; transistor X9 turns off; and the current $I_S$ through the output port is constrained to be equal to the current $I_8$ through transistor X8. However, current $I_8$ is constrained to be less than or equal to a maximum value that is proportional to current $I_2$ through X2; current $I_2$ is equal to current $I_3$ through X3; and current $I_3$ is constrained to be proportional to the current Iref due to the current mirror relationship between X1 and X3.

In some embodiments, the current generator includes: a first transistor, a second transistor, a third transistor, a first pair of switches and a second pair of switches. A drain of the second transistor and a drain of the third transistor are connected to each other and to the output port of the current generator. A source of the second transistor is coupled to the drive voltage node. A source of the third transistor is coupled to ground. The first pair of switches is configured to turn off the third transistor and to enable a first connection when the input voltage is low. When the first connection is enabled, the second transistor is controlled by a fourth transistor in a first current mirror relationship. The second pair of switches is configured to turn off the second transistor and to enable a second connection when the input voltage is high. When the second connection is enabled, the third transistor is controlled by the first transistor in a second current mirror relationship. The fourth transistor couples in series with a fifth transistor between the voltage drive node and ground. The fifth transistor is controlled by the first transistor in a third current mirror relationship. (In a current mirror relationship between two transistors, the transistor that is diode-connected is said to be the controlling transistor, and the other transistor is said to be the controlled transistor.)

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A driver circuit having a limited slew rate, the driver circuit comprising:

a current generator having an input port, an output port and reference port;

an output transistor, wherein the output port of the current generator is coupled to the gate of the output transistor;

wherein the current generator is configured to control a first current flowing through the output port based on an input voltage appearing at the input port, wherein the current generator is configured to limit the absolute value of the first current to be less than or equal to a maximum that is determined by a reference current provided at the reference port, wherein the current generator includes:
a transistor A;
a first chain of transistors; and
a second chain of transistors;
wherein the first chain and the second chain are coupled in parallel between a drive voltage and round, wherein a first transistor of the first chain is coupled to form a current mirror with a first transistor of the second chain, wherein the transistor A is configured to form a current mirror with a last transistor of the first chain, wherein the transistor A is also configured to form a current mirror with a last transistor of the second chain, wherein the reference current is provided to the drain of the transistor A, wherein the input port is coupled to the gates of second and third transistors in the second chain, wherein the second and third transistors of the second chain are coupled to a common node in drain-to-drain fashion, wherein the common node is coupled to the output port.

2. The driver circuit of claim 1, wherein a drain of the output transistor is coupled to a supply voltage via a resistor.

3. A driver circuit having a limited slew rate, the driver circuit comprising:
a current generator having an input port, an output port and reference port;
an output transistor, wherein the output port of the current generator is coupled to the gate of the output transistor;
wherein the current generator is configured to control a first current flowing through the output port based on an input voltage appearing at the input port, wherein the current generator is configured to limit the absolute value of the first current to be less than or equal to a maximum that is determined by a reference current provided at the reference port, wherein the current generator includes:
first, second and third transistors, wherein a drain of the second transistor and a drain of the third transistor are connected to each other and to the output port of the current generator, wherein a source of the second transistor is coupled to a drive voltage node, wherein a source of the third transistor is coupled to ground;
a first pair of switches configured to turn off the third transistor and to enable a first connection when the input voltage is low, wherein, when the first connection is enabled, the second transistor is controlled by a fourth transistor in a first current mirror relationship;
a second pair of switches configured to turn off the second transistor and to enable a second connection when the input voltage is high, wherein, when the second connection is enabled, the third transistor is controlled by the first transistor in a second current mirror relationship.

4. The driver circuit of claim 3, wherein the fourth transistor couples in series with a fifth transistor between the voltage drive node and wound, wherein the tifth transistor is controlled by the first transistor in a third current mirror relationship.

5. The driver circuit of claim 3, wherein a drain of the output transistor is coupled to a supply voltage via a resistor.

6. A driver circuit having a limited slew rate, the driver circuit comprising:
a current generator having an input port, an input port and reference port;
an output transistor, wherein the output port of the current generator is coupled to the gate of the output transistor;
wherein the current generator is configured to control a first current flowing through the output port based on an input voltage appearing at the input port, wherein the current generator is configured to limit the absolute value of the first current to be less than or equal to a maximum that is determined by a reference current provided at the reference port
a transistor B coupled to a drive voltage node of the current generator, wherein a gate and a drain of the transistor B are shorted together, wherein the drive voltage node is driven with a known drive current, and
a transistor C whose gate is coupled to the drain of the output transistor, wherein the drain of the transistor C is coupled to the dr voltage node of the current generator, wherein the source of the transistor C is coupled to ground through a first resistor.

7. The driver circuit of claim 6, wherein the transistor B is coupled to the drive voltage node through a second resistor.

8. A driver circuit having a limited slew rate, the driver circuit comprising:
a current generator having and input port, an output port and reference port;
an output transistor, wherein the output port of the current generator is coupled to the gate of the output transistor;
wherein the current generator is configured to control a first current flowing through the output port based on an input voltage appearing at the input port, wherein the current generator is configured to limit the absolute value of the first current to be less than or equal to a maximum that is determined by a reference current provided at the reference port;
a capacitor coupling between the output port of the current generator and a drain of the output transistor; and
wherein the output port of the current generator is coupled to the gate of the output transistor through an amplifier.

9. The driver circuit of claim 8, wherein the amplifier includes a diamond follower circuit.

10. The driver circuit of claim 8, wherein the amplifier includes an input stage and an output stage that are coupled together, where the input stage is coupled between a voltage node Vdd and ground, wherein a supply voltage node of the current generator is coupled to the voltage node Vdd, wherein the output stage is coupled between a voltage node Vdrive and ground.

11. The driver circuit of claim 10 further comprising a transistor B, wherein a gate and a drain of the transistor B are shorted together, wherein the drain of the transistor B couples to the voltage node Vdrive, wherein a source of the transistor couples to ground.

12. The driver circuit of claim 8, wherein a drain of the output transistor is coupled to a supply voltage via a resistor.

13. A circuit comprising:
an input port, an output port, a drive port, and a reference port;
first, second, third, fourth, fifth, sixth and seventh and eighth transistors, wherein second and third transistors are coupled to a form a first series between a drive voltage rail and ground, wherein fourth, fifth, sixth and seventh transistors are coupled to form a second series between the drive voltage rail and ground, wherein the first and third transistors are coupled to form a first current mirror, wherein the first and seventh transistors are coupled to form a second current mirror, wherein the second and fourth transistors are coupled to form a third current mirror, and wherein the eighth transistor is diode-connected between the drive rail and ground;
wherein the input port is coupled to gates of the fifth and sixth transistors, wherein the output port is coupled to drains of the fifth and sixth transistors, wherein the reference port is coupled to the drain and gate of the first transistor, wherein the fifth and sixth transistors comprise one PMOS transistor and one NMOS transistor; and wherein the drive port is coupled to the drive rail, and is configured to receive a known drive current that generates a voltage level on the drive rail.

14. The circuit of claim 13, wherein the second and third transistors comprise one PMOS transistor and one NMOS transistor.

15. The circuit of claim 13, wherein the reference port is supplied with a constant reference current.

16. The driver circuit of claim 13, wherein the second, fourth and fifth transistors are PMOS transistors, wherein the first, third, sixth and seventh transistors are NMOS transistors.

17. A bridge driver device comprising:
Four driver circuits coupled in the H-bridge topology, wherein each of the four driver circuits includes:
a current generator having an input port, an output port and reference port;
an output transistor, wherein the output port of the current generator is coupled to the gate of the output transistor;
wherein the current generator is configured to control a first current flowing through the output port based on an input voltage appearing at the input port, wherein the current generator is configured to limit the absolute value of the first current to be less than or equal to a maximum that is determined by a reference current provided at the reference port;
wherein the output transistors of a first and second of the four driver circuits are PMOS transistors.

18. The bridge driver device of claim 17, wherein each of the four driver circuits also includes a capacitor that couples between a gate of the corresponding output transistor and a drain of the corresponding output transistor.

19. The bridge driver device of claim 17, further comprising a fan as a load device of the H-bridge topology.

* * * * *

UNITED STATES PATENT AND TRADEMARK OFFICE
CERTIFICATE OF CORRECTION

| | | |
|---|---|---|
| PATENT NO. | : 8,633,736 B2 | Page 1 of 1 |
| APPLICATION NO. | : 12/789005 | |
| DATED | : January 21, 2014 | |
| INVENTOR(S) | : Paul F. Illegems | |

It is certified that error appears in the above-identified patent and that said Letters Patent is hereby corrected as shown below:

In the Claims

Column 13,
Line 53 "…drive node and wound, wherein the tifth transistor is con-…" ---Change to--- "…drive node and ground, wherein the fifth transistor is con-…"

Signed and Sealed this
Twenty-second Day of April, 2014

Michelle K. Lee
*Deputy Director of the United States Patent and Trademark Office*